(12) United States Patent
Forbes et al.

(10) Patent No.: US 6,838,726 B1
(45) Date of Patent: Jan. 4, 2005

(54) HORIZONTAL MEMORY DEVICES WITH VERTICAL GATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/584,566

(22) Filed: May 31, 2000

(51) Int. Cl.⁷ .............................................. H01L 29/788
(52) U.S. Cl. ...................................... 257/321; 257/316
(58) Field of Search ................................. 257/316, 321

(56) References Cited

U.S. PATENT DOCUMENTS

| | | | |
|---|---|---|---|
| 4,051,354 A | 9/1977 | Choate ........................ 235/312 |
| 5,327,380 A | 7/1994 | Kersh, III et al. .......... 365/195 |
| 5,386,132 A | 1/1995 | Wong .......................... 257/316 |
| 5,583,360 A | 12/1996 | Roth et al. ................... 257/316 |
| 5,625,213 A | * 4/1997 | Hong .......................... 257/321 |
| 5,661,055 A | 8/1997 | Hsu et al. .................... 438/259 |
| 5,793,080 A | * 8/1998 | Hwang ........................ 257/316 |
| 5,847,425 A | 12/1998 | Yuan et al. .................. 257/315 |
| 5,910,912 A | * 6/1999 | Hsu ............................. 257/321 |
| 5,991,225 A | 11/1999 | Forbes et al. .......... 365/230.06 |
| 6,078,076 A | * 6/2000 | Lin ............................. 257/321 |
| 6,093,945 A | * 7/2000 | Yang .......................... 257/316 |
| 6,124,729 A | 9/2000 | Noble et al. ................... 326/41 |
| 6,133,601 A | * 10/2000 | Watanabe ..................... 257/316 |
| 6,208,164 B1 | 3/2001 | Noble et al. ................... 326/41 |
| 6,219,299 B1 | 4/2001 | Forbes et al. .......... 365/230.03 |
| 6,222,788 B1 | 4/2001 | Forbes et al. .......... 365/230.06 |
| 6,377,070 B1 | 4/2002 | Forbes .......................... 326/41 |

OTHER PUBLICATIONS

Horiguchi et al., *IEDM* A direct Tunneling . . . Structure pp 922–924, Dec. 1999.*

"Frequently–Asked Questions (FAQ) About Programmable Logic", *OptiMagic, Inc.*, http://www.optimagic.com/faq.html, pp. 1–18, (1997).

Chen, W., et al., "Very uniform and high aspect ratio anisotrophy SIO2 etching process in magnetic neutral loop discharge plasma", *J. Vac. Sci. Technol. A, 17* (5), pp. 2546–2550, (1999).

(List continued on next page.)

*Primary Examiner*—Jerome Jackson
(74) *Attorney, Agent, or Firm*—Schwegman, Lundberg, Woessner & Kluth, P.A.

(57) ABSTRACT

Structures and methods for memory devices are provided which operate with lower control gate voltages than conventional floating gate transistors, and which do not increase the costs or complexity of the device fabrication process. In one embodiment of the present invention, the novel memory cell includes a source region and a drain region separated by a channel region in a horizontal substrate. A first vertical gate is separated from a first portion of the channel region by a first oxide thickness. A second vertical gate is separated from a second portion of the channel region by a second oxide thickness. According to the teachings of the present invention, the total capacitance of these memory devices is about the same as that for the prior art of comparable source and drain spacings. However, according to the teachings of the present invention, the floating gate capacitance (CFG) is much smaller than the control gate capacitance (CCG) such that the majority of any voltage applied to the control gate will appear across the floating gate thin tunnel oxide.

32 Claims, 11 Drawing Sheets

OTHER PUBLICATIONS

Dipert, B., et al., "Flash Memory Goes Mainstream", *IEEE Spectrum, 30*, 48–52, (Oct. 1993).

Hodges, D.A., et al., *Analysis and Design of Digital Integrated Circuits*, McGraw–Hill Book Company, 2nd Edition, 394–396, (1988).

Hodges, D.A., et al., *Analysis and Design of Digital Integrated Circuits, 2nd Edition*, McGraw–Hill Publishing. New York, pp. 354–357, (1988).

Johnson, J., et al., "IBM's 0.5 micrometer Embedded Flash Memory Technology", *MicroNews, 4 (3)*, http://www.chips.ibm.com/micronews/vol14_no3/flash.html, pp. 1–7, (1998).

Landheer, D., et al., "Formation of high–quality silicon dioxide films by electron cyclotron resonance plasma oxidation and plasma–enhanced chemical vapour deposition", *Thin Solid Films, 293*, pp. 52–62, (1997).

Moore, W.R., "A Review of Fault–Tolerant Techniques for the Enhancement of Integrated Ccircuit Yield", *Proceedings fo the IEEE, 74 (5)*, 684–698, (May 1986).

Nozawa, R., et al., "Low temperature polycrystalline silicon film formation with and without charged species in an electron cyclotron resonance $SiH_4/H_2$ plasma–enhanced chemical vapor deposition", *J. Vac. Sci. Technol. A, 17 (5)*, pp. 2542–2545, (1999).

Patel, P., et al., "Low temperature VUV enhanced growth of thin silicon dioxide films", *Applied Surface Science, 46*, pp. 352–356, (1990).

Rueger, N.R., et al., "Selective etching of $SiO_2$ over polycrystalline silicon using $CHF_3$ in an inductively coupled plasma", *J. Vac. Sci. Technol. A, 17 (5)*, pp. 2492–2502, (1999).

Shindo, W., et al., "Low–temperature large–grain poly–Si direct deposition by microwave plasma enhanced chemical vapor disposition using $SiH_4/Xe$", *J. Vac. Sci. Technol. A, 17 (5)*, pp. 3134–3138, (1999).

Usami, K., et al., "Thin Si Oxide films for MIS tunnel emitter by hollow cathode enhanced plasma", *Thin Films, 281–282*, pp. 412–414, (1996).

Vallon, S., et al., "Polysilicon–germanium gate patterning studies in a high density plasma helicon source", *J. Vac. Sci. Technol. A, 15 (4)*, pp. 1874–1880, (1997).

* cited by examiner

HORIZONTAL MEMORY DEVICES WITH VERTICAL GATES

CROSS REFERENCE TO RELATED APPLICATIONS

This application is related to the following co-pending, commonly assigned U.S. patent applications: "Programmable Logic Arrays with Transistors with Vertical Gates," Ser. No. 09/583,584, and "Programmable Memory Decode Circuits with Vertical Gates," Ser. No. 09/584,564, which are filed on even date herewith and each of which disclosure is herein incorporated by reference.

TECHNICAL FIELD OF THE INVENTION

This invention relates generally to integrated circuits and in particular to horizontal memory devices with vertical gates.

BACKGROUND OF THE INVENTION

One difficulty with EEPROM, EAPROM, and flash memory devices is the adverse capacitance ratio between the control gate and the floating gate. That is, the capacitance between the control gate to floating gate (CCG) is about the same as the floating gate to substrate capacitance (CFG). FIG. 1A is an illustration of a horizontal EEPROM, EAPROM, or flash memory device formed according to the teachings of the prior art. As shown in FIG. 1A, conventional horizontal floating gate transistor structures include a source region 110 and a drain region 112 separated by a channel region 106 in a horizontal substrate 100. A floating gate 104 is separated by a thin tunnel gate oxide 105 shown with a thickness (t1). A control gate 102 is separated from the floating gate 104 by an intergate dielectric 103 shown with a thickness (t2). Such conventional devices must by necessity have a control gate 102 and a floating gate 104 which are about the same size in width.

FIG. 1B is an illustration of a vertical EEPROM, EAPROM, or flash memory device formed according to the disclosure in a co-pending, commonly assigned application by W. Noble and L. Forbes, entitled "Field programmable logic array with vertical transistors," Ser. No. 09/03261, filed Feb. 27, 1998. FIG. 1B illustrates that vertical floating gate transistor structures have a stacked source region 110 and drain region 112 separated by a vertical channel region 106. The vertical floating gate transistor shown in FIG. 1B further includes a vertical floating gate 104 separated by a thin tunnel gate oxide 105 from the channel region 106. A vertical control gate 102 is separated from the floating gate 104 by an intergate dielectric 103. As shown in FIG. 1B, the vertical control gate 102 and the vertical floating gate 104 are likewise about the same size in width relative to the channel region 106.

Conventionally, the insulator, or intergate dielectric, 103 between the control gate 102 and the floating gate 104 is thicker (t2) than the gate oxide 105 (t1) to avoid tunnel current between the gates. The insulator, or intergate dielectric, 103 is also generally made of a higher dielectric constant insulator 103, such as silicon nitride or silicon oxynitride. This greater insulator thickness (t2) tends to reduce capacitance. The higher dielectric constant insulator 103, on the other hand, increases capacitance. As shown in FIG. 1C, the net result is that the capacitance between the control gate and the floating gate (CCG) is about the same as the gate capacitance of the thinner gate tunneling oxide 105 between the floating gate and the substrate (CFG). This undesirably results in large control gate voltages being required for tunneling, since the floating gate potential will be only about one half that applied to the control gate.

As design rules and feature size (F) in floating gate transistors continue to shrink, the available chip surface space in which to fabricate the floating gate also is reduced. In order to achieve a higher capacitance between the control gate and floating gate (CCG) some devices have used even higher dielectric constant insulators between the control gate and floating gate. Unfortunately, using such higher dielectric constant insulators involves added costs and complexity to the fabrication process.

Therefore, there is a need in the art to provide memory devices which can operate with lower control gate voltages and which do not increase the costs or complexity of the fabrication process. Further such devices should desirably be able to scale with shrinking design rules and feature sizes in order to provide even higher density integrated circuits.

SUMMARY OF THE INVENTION

The above mentioned problems with memory devices and other problems are addressed by the present invention and will be understood by reading and studying the following specification. Structures and methods for memory devices are provided which can operate with lower applied control gate voltages than conventional floating gate transistor memory devices, and which do not increase the costs or complexity of the device fabrication process. These systems and methods are fully scalable with shrinking design rules and feature sizes in order to provide even higher density integrated circuits. The total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

In one embodiment of the present invention, a novel memory cell is provided. The memory cell includes a source region and a drain region separated by a channel region in a horizontal substrate. A first vertical gate is separated from a first portion of the channel region by a first oxide thickness. A second vertical gate is separated from a second portion of the channel region by a second oxide thickness. According to one embodiment the memory cell includes a flash memory cell. In another embodiment, the memory cell includes an electronically erasable and programmable read only memory (EEPROM) cell. In another embodiment, the memory cell includes an electronically alterable and programmable read only memory (EAPROM) cell. In one embodiment of the present invention, the first vertical gate and the second vertical gate have a horizontal width of approximately 100 nanometers (nm). Also, in one embodiment the first oxide thickness is approximately 60 Angstroms (Å) and the second oxide thickness is approximately 100 Angstroms (Å).

Another embodiment of the present invention includes a method for forming a novel memory cell. The method includes forming a source region and a drain region separated by a channel region in a horizontal substrate. The method includes forming a first vertical gate above a first portion of the channel region and separated from the channel region by a first oxide thickness. The method further includes forming a second vertical gate above a second portion of the channel region and separated from the channel region by a second oxide thickness. Forming the second vertical gate includes forming the second vertical gate parallel to and opposing the first vertical gate.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
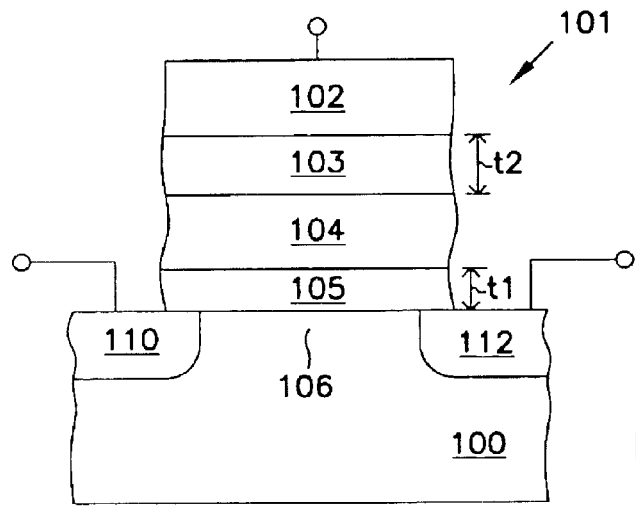
FIG. 1A is an illustration of a horizontal EEPROM, EAPROM, or flash memory device formed according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The term conductor is understood to include semiconductors, and the term insulator is defined to include any material that is less electrically conductive than the materials referred to as conductors. The following detailed description is not to be taken in a limiting sense, and the scope of the present invention is defined only by the appended claims, along with the full scope of equivalents to which such claims are entitled.

Figure 2A:
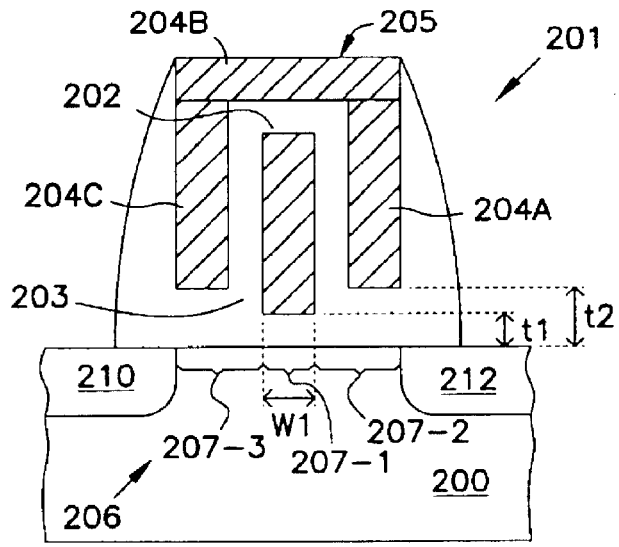
FIG. 2A is a block diagram of an embodiment for a novel memory cell, transistor, or floating gate transistor formed according to the teachings of the present invention.

FIG. 2A is a block diagram of an embodiment for a novel memory cell, transistor, or floating gate transistor 201 formed according to the teachings of the present invention. As shown in FIG. 2A, the memory cell 201 includes a source region 210 and a drain region 212 separated by a channel region 206 in a horizontal substrate 200. According to the teachings of the embodiment shown in FIG. 2A, the memory cell 201 includes a first vertical gate 202 located above a first portion, or first region, 207-1, of the channel region 206. In one embodiment, the first vertical gate 202 includes or serves as a floating gate 202 for the memory cell 201. In an alternative embodiment, the first vertical gate 202 includes or serves as a control gate 202 for memory cell 201. The first vertical gate is separated from the channel region 206 by a first thickness insulator material, or first oxide thickness (t1). A second vertical gate 204A is located above a second portion, or second region, 207-2 of the channel region 206. The second vertical gate 204A is separated from the channel region 206 by a second thickness insulator material, or second oxide thickness (t2). The memory cell 201 embodiment shown in FIG. 2A further includes a third vertical gate 204C located above a third portion, or third region, 207-3 of the channel region 206. The third vertical gate is separated from the channel region 206 by the second thickness insulator material, or second oxide thickness (t2). In one embodiment of the present invention, the first oxide thickness (t1) is approximately 60 Angstroms (Å) and the second oxide thickness (t2) is approximately 100 Angstroms (Å). According to the teachings of the present invention, the first thickness insulator material (t1) and the second thickness insulator material (t2) are formed of silicon dioxide ($SiO_2$).

As shown in the embodiment of FIG. 2A, the second and the third vertical gates, 204A and 204C respectively, are parallel to and on opposing sides of the first vertical gate 202 forming a symmetrical structure. The memory cell 201 embodiment of FIG. 2A further includes a horizontal gate member 204B which couples the second 204A and the third 204C vertical gates. The horizontal gate member 204B is located above the first vertical gate 202 and separated therefrom by an intergate dielectric 203. In the embodiment shown in FIG. 2A, the second and the third portion, 207-2 and 207-3 respectively, of the channel region 206 are adjacent to the source region 210 and the drain region 212 respectively.

According to one embodiment of the present invention, the first vertical gate 202, the second vertical gate 204A, the horizontal gate member 204B, and the third vertical gate 204C include polysilicon gates which are separated from one another by the intergate dielectric 203. According to the teachings of the present invention, the intergate dielectric includes an intergate dielectric formed from silicon dioxide ($SiO_2$). In one embodiment, the intergate dielectric 203 between the first vertical gate 202, the second vertical gate 204A, the horizontal gate member 204B, and the third vertical gate 204C has a thickness approximately equal to the first oxide thickness (t1), or first thickness insulator material. In one embodiment of the present invention, the first vertical gate 202, the second vertical gate 204A, and the third vertical gate 204C each have a horizontal width of approximately 100 nanometers (nm).

As described above, in one embodiment, the first vertical gate 202 in memory cell 201 serves as a floating gate 202. In this embodiment, the second vertical gate 204A, the horizontal gate member 204B, and the third vertical gate 204C serve as control gates. In an alternative embodiment, the first vertical gate 202 in memory cell 201 serves as a control gate for the memory cell 201. In this embodiment, the second vertical gate 204A, the horizontal gate member 204B, and the third vertical gate 204C serve as floating gates. In one embodiment, the first vertical gate 202, the second vertical gate 204A, and the third vertical gate 204C have a vertical height, respectively, of approximately 500 nanometers (nm).

Figure 2B:
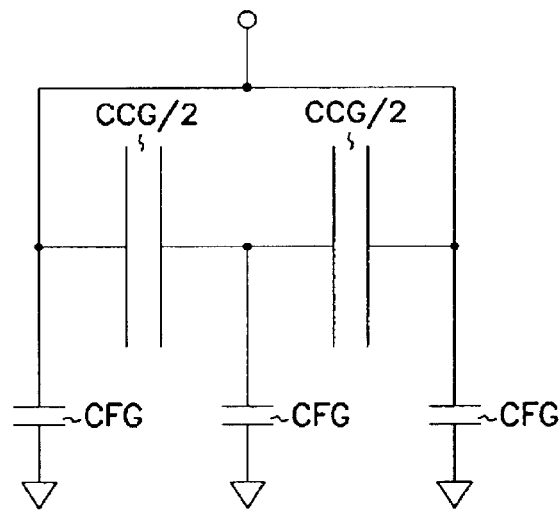
FIG. 2B is a schematic diagram illustrating the respective capacitances between the between respective components of the novel memory cell shown in FIG. 2A.
Figure 2C:
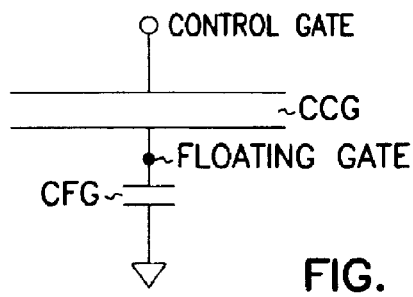
FIG. 2C is a simplified schematic diagram representing the same capacitance relationship shown in FIG. 2B.

FIG. 2B is a schematic diagram illustrating the respective capacitances between the between the first vertical gate 202, the second vertical gate 204A, the horizontal gate member 204B, and the third vertical gate 204C, e.g. the control gate capacitance (CCG), as well as between these vertical gates and the channel region 206, e.g. the floating gate capacitance (CFG). FIG. 2C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 2B and 2C, the floating gate capacitance (CFG) of the present invention is much smaller than the control gate capacitance (CCG).

According to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

Figure 3A:
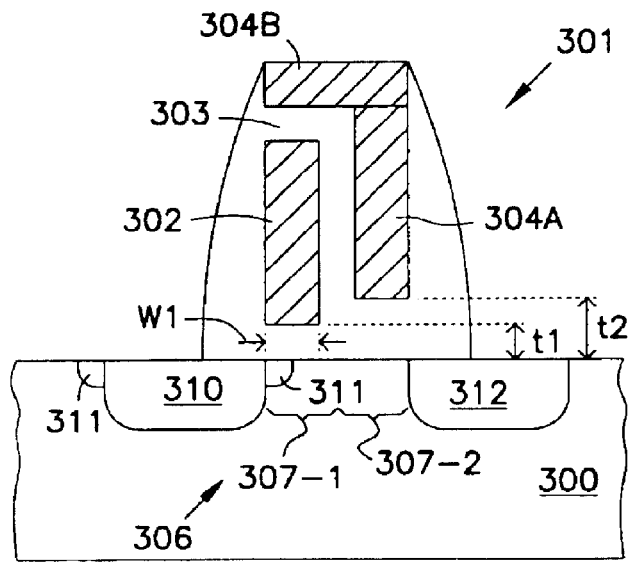
FIG. 3A is a block diagram of another, asymmetrical embodiment for a novel memory cell, transistor, or floating gate transistor formed according to the teachings of the present invention.

FIG. 3A is a block diagram of another, asymmetrical embodiment for a novel memory cell, transistor, or floating gate transistor 301 formed according to the teachings of the present invention. As shown in FIG. 3A, the memory cell 301 includes a source region 310 and a drain region 312 separated by a channel region 306 in a horizontal substrate 300. According to the teachings of the embodiment shown in FIG. 3A, the memory cell 301 includes a first vertical gate 302 located above a first portion, or first region, 307-1, of the channel region 306. In one embodiment, the first vertical gate 302 includes or serves as a vertical floating gate. 302 for the memory cell 301. In an alternative embodiment, the first vertical gate 302 includes or serves as a vertical control gate 302 for memory cell 301. The first vertical gate is separated from the channel region 306 by a first thickness insulator material, or first oxide thickness (t1). A second vertical gate 304A is located above a second portion, or second region, 307-2 of the channel region 306. The second vertical gate 304A is parallel to and opposes the first vertical gate 302 and is separated therefrom by an intergate dielectric 303. The second vertical gate 304A is separated from the channel region 306 by a second thickness insulator material, or second oxide thickness (t2). According to the teachings of the present invention, the first thickness insulator material (t1) and the second thickness insulator material (t2) are formed of silicon dioxide ($SiO_2$). In one embodiment, the first thickness insulator material (t1) is approximately 60 Angstroms (Å), and wherein the second thickness insulator material (t2) is approximately 100 Angstroms (Å).

According to one embodiment of the present invention, the second vertical gate 304A includes a horizontal gate member 304B which couples to the second vertical gate 304A and is separated from the first vertical gate by the intergate dielectric 303. As shown in FIG. 3A, the horizontal member 304B is located above a portion of the first vertical gate 302. According to the teachings of the present invention, the intergate dielectric includes an intergate dielectric formed from silicon dioxide ($SiO_2$). In one embodiment, the intergate dielectric 303 between the first vertical gate 302, the second vertical gate 304A, and the horizontal gate member 304B has a thickness approximately equal to the first oxide thickness (t1), or first thickness insulator material. In one embodiment of the present invention, the first vertical gate 302 and the second vertical gate 304A each have a horizontal width of approximately 100 nanometers (nm). In one embodiment, the first vertical gate 302 and the second vertical gate 304A respectively each have a vertical height of approximately 500 nanometers (nm).

As shown in FIG. 3A, the first vertical gate 302 which is separated from a first portion 307-1 of the channel region is separated from a first portion 307-1 of the channel region 306 which includes a portion of the channel region 306 adjacent to the source region 310. The second vertical gate 304A which is separated from a second portion 307-2 of the channel region 306 is separated from a second portion 307-2 of the channel region which includes a portion of the channel region 306 adjacent to the drain region 312. As one of ordinary skill in the art will understand upon reading this disclosure, the relationship of the structure shown in FIG. 3A to the source and drain regions, 310 and 312 respectively, can be reversed. As shown in FIG. 3A, in one embodiment of the present invention, source and/or drain region extension, such as source extension 311, are included in memory cell 301. As will be understood by one of ordinary skill in the art upon reading this disclosure, the same can apply to the memory cell structure shown in FIG. 2A.

Figure 3B:
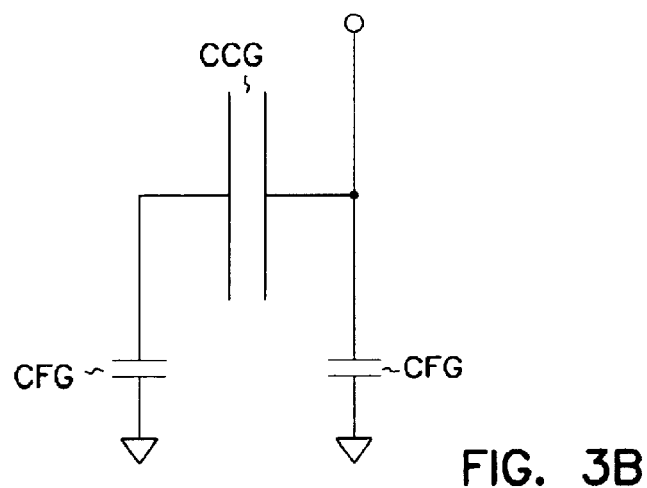
FIG. 3B is a schematic diagram illustrating the respective capacitances between the between respective components of the novel memory cell shown in FIG. 3A.
Figure 3C:
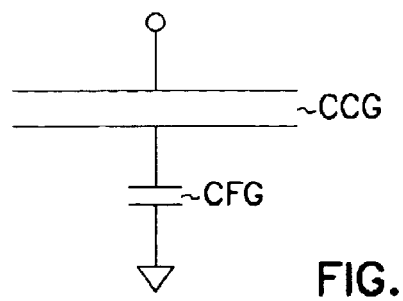
FIG. 3C is a simplified schematic diagram representing the same capacitance relationship shown in FIG. 3B.

FIG. 3B is a schematic diagram illustrating the respective capacitances between the between the first vertical gate 302, the second vertical gate 304A, and the horizontal gate member 304B, e.g. the control gate capacitance (CCG), as well as between these vertical gates and the channel region 306, e.g. the floating gate capacitance (CFG). FIG. 3C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 3B and 3C, the floating gate capacitance (CFG) of the present invention is much smaller than the control gate capacitance (CCG). In other words, a capacitance between the vertical control gate 304A and the floating gate 302 (CCG) is greater than a capacitance between the floating gate 302 and the channel 306 (CFG).

Hence again, according to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

FIGS. 4A–4I are useful in illustrating the methods of forming a novel memory cell, transistor or floating gate transistor according to the teachings of the present invention. According to the teachings of the present invention an edge-defined poly-silicon vertical gate is defined over the thin gate oxide in the active device area. This vertical gate is re-oxidized and another poly-silicon layer is deposited over the structure, and anisotropically or directionally etched to define another polysilicon vertical gate. These can be either symmetrical gate structures as shown and described in connection with FIG. 2A or asymmetrical gate structures as shown and described in connection with FIG. 3A. The methods of the present invention result in a novel memory cell which has a larger capacitance between the control gate and the floating gate, and only a smaller capacitance between the floating gate and the substrate. Thus, according to the teachings of the present invention, smaller control gate voltages than are required by conventional memory devices will result in large potential differences between the floating gate and substrate. This is due to the fact that the capacitance ratio as illustrated in FIGS. 2B, 2C, 3B, and 3C is more advantageous in the novel memory cell embodiments of the present invention.

Figure 4A:
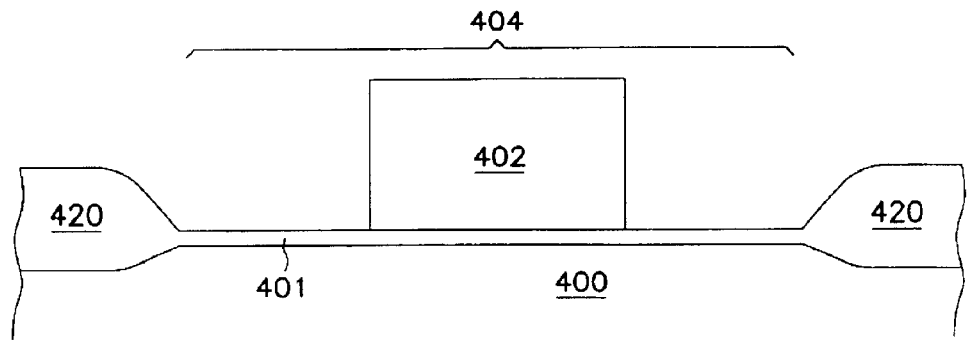
FIGS. 4A–4I illustrate embodiments of the methods for forming the novel memory cell, transistor or floating gate transistor according to the teachings of the present invention.

FIG. 4A illustrates the structure after the first sequence of processing steps. In FIG. 4A, a thin gate oxide 401 is formed over an active device area 404, between a pair of field isolation oxides (FOXs) 420, in a horizontal surface of a substrate 400. The thin gate oxide 401 is formed to a first oxide thickness (t1). In one embodiment, the thin gate oxide 401 is formed to a thickness (t1) of approximately 60 Angstroms (Å). One of ordinary skill in the art will understand upon reading this disclosure the various suitable manners in which a thin gate oxide 401 can be formed over the active device area 403. For example, in one embodiment, the thin gate oxide can be formed by thermal oxidation, and the FOXs can be formed using local oxidation of silicon (LOCOS) as the same are known and understood by one of ordinary skill in the art. After growth of the thin gate oxide 401 by thermal oxidation, and the LOCOS isolation 420, a thick layer of sacrificial oxide 402 is deposited over the surface of the thin gate oxide 401. In one embodiment, the thick layer of sacrificial oxide 402 is deposited to a thickness of approximately 0.5 micrometers ($\mu$m) using a low-pressure chemical vapor deposition (LPCVD) technique. Using a photoresist mask, according to photolithography techniques which are known and understood by one of ordinary skill in the art, this thick oxide 402 is etched. The desired thin-oxide 401 can be regrown in the areas not covered by the remaining thick sacrificial oxide 402. According to one embodiment of the present invention, an inductively coupled plasma reactor (ICP) using $CHF_3$ may be employed for this etching as the same is disclosed in an article by N. R. Rueger et al., entitled "Selective etching of $SiO_2$ over polycrystalline silicon using $CHF_3$ in an inductively couples plasma reactor", J. Vac. Sci. Technol., A, 17(5), p. 2492–2502, 1999. Alternatively, a magnetic neutral loop discharge plasma can be used to etch the thick oxide 402 as disclosed in an article by W. Chen et al., entitled "Very uniform and high aspect ratio anisotropy $SiO_2$ etching process in magnetic neutral loop discharge plasma", ibid, p. 2546–2550. The latter is known to increase the selectivity of $SiO_2$ to photoresist and/or silicon. The structure is now as appears in FIG. 4A.

Figure 4B:
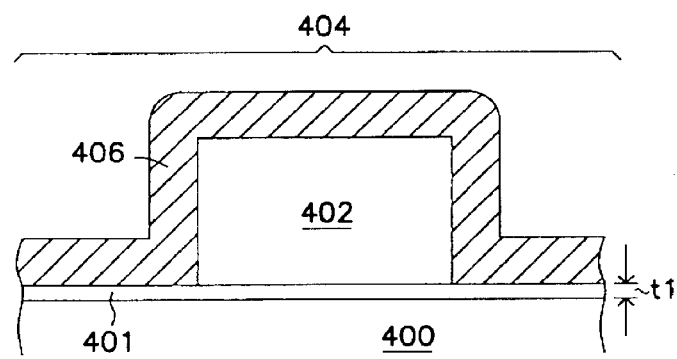

FIG. 4B illustrates the structure following the next sequence of fabrication steps. In FIG. 4B, a polysilicon layer 406 is deposited to a thickness of approximately 200 nanometers (nm). A conventional chemical vapor deposition (CVD) reactor may be used to deposit polycrystalline silicon films at substrate temperature in excess of 650° Celsius (C). In an alternative embodiment, a plasma-enhanced CVD process (PECVD) can be employed if a lower thermal budget is desired. In another alternative embodiment, a microwave-excited plasma enhanced CVD of poly-silicon using $SiH_4$/Xe at temperature as low as 300° C. can be performed to deposit the polysilicon layer 406 as disclosed by Shindo et al., ibid. p. 3134–3138. According to this process embodiment, the resulting grain size of the polysilicon film was measured to be approximately 25 nm. Shindo et al. claim that the low-energy (approximately 3 eV), high-flux, ion bombardment utilizing Xe ions on a growing film surface activates the film surface and successfully enhances the surface reaction/migration of silicon, resulting in high quality film formation at low temperatures. In another alternative embodiment, the polysilicon layer 406 can be formed at an even lower temperature, e.g. 150° C., with and without charged species in an electron cyclotron resonance (ECR) plasma-enhanced CVD reactor as disclosed in an article by R. Nozawa et al., entitled "Low temperature polycrystalline silicon film formation with and without charged species in an electron cyclotron resonance $SiH_4$ plasma-enhanced chemical vapor deposition", ibid, p. 2542–2545. In this article, R. Nozawa et al. describe that in using an atomic force microscope they found that the films formed without charged species were smoother than those films formed with charged species. According to the teachings of the present invention, it is important to keep the smoothness of polysilicon layer 406. This will be evident from reading the subsequently described process steps in which another polysilicon layer will be fabricated later onto polysilicon layer 406 with a very thin insulation layer between them. The structure is now as appears in FIG. 4B.

Figure 4C:
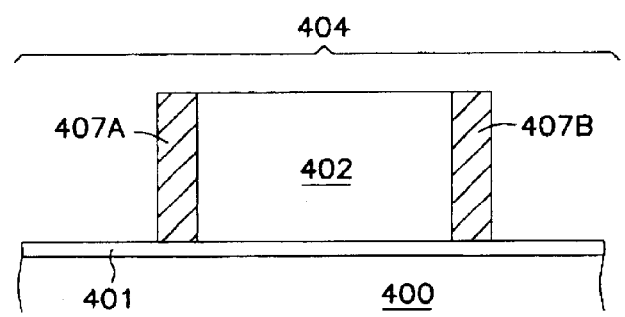

FIG. 4C illustrates the structure following the next sequence of processing steps. FIG. 4C shows a cross section of the resulting vertical gate structures, 407A and 407B, over the active device area 404 after the polysilicon layer 406 has been anisotropically etched. As shown in FIG. 4C, the polysilicon vertical gate structures, 407A and 407B, remain only at the sidewalls of the thick sacrificial oxide 402. In one embodiment, the polysilicon layer 406 is anisotropically etched such that the vertical gate structures, 407A and 407B remaining at the sidewalls of the thick sacrificial oxide 402 have a horizontal width (W1) of approximately 100 nanometers (nm). In one embodiment, the polysilicon layer 406 can be anisotropically etched to form the vertical gate structures, 407A and 407B, through the use of a high-density plasma helicon source for anisotropic etching of a dual-layer stack of poly-silicon on $Si_{1-x} Ge_x$ as described in an article by Vallon et al., entitled "Poly-silicon-germanium gate patterning studies in a high density plasma helicon source", J. Vac. Sci. technol., A, 15(4), p. 1874–80, 1997. The same is incorporated herein by reference. In this article, wafers were described as being etched in a low pressure, high density plasma helicon source using various gas mixtures of $Cl_2$, HBr, and $O_2$. Also, according to this article, process conditions were optimized to minimize the gate oxide 401 consumption. The structure is now as shown in FIG. 4C.

Figure 4D:
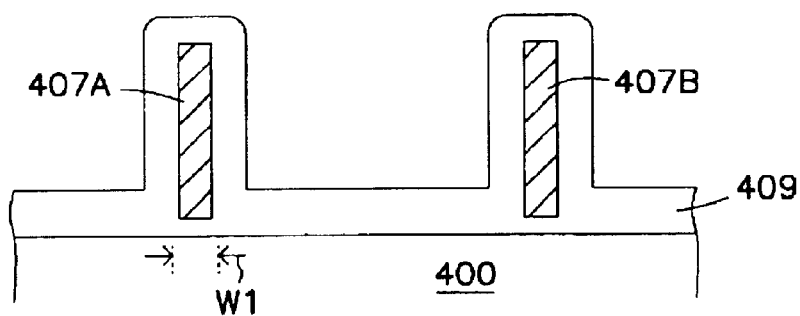

FIG. 4D illustrates the structure after the next series of process steps. In FIG. 4D, the thick sacrificial oxide 402 is removed. As one of ordinary skill in the art will understand upon reading this disclosure the thick sacrificial oxide layer can be removed using any suitable, oxide selective etching technique. As shown in FIG. 4D, the remaining polysilicon vertical gate structures, 407A and 407B, are oxidized to form insulator, intergate dielectric, oxide layer, or silicon dioxide ($SiO_2$) layer 409. In one embodiment, a conventional thermal oxidation of silicon may be utilized at a high temperature, e.g. greater than 900° C. In an alternative embodiment, for purposes of maintaining a low thermal budget for advanced ULSI technology, a lower temperature process can be used. One such low temperature process includes the formation of high-quality silicon dioxide films by electron cyclotron resonance (ECR) plasma oxidation at temperature as low as 400° C. as described in an article by Landheer, D. et al., entitled "Formation of high-quality silicon dioxide films by electron cyclotron resonance plasma oxidation and plasma-enhanced chemical vapor deposition", Thin Solid Films, vol. 293, no. 1–2, p. 52–62, 1997. The same is incorporated herein by reference. Another such low temperature process includes a low temperature oxidation method using a hollow cathode enhanced plasma oxidation system as described in an article by Usami, K. et al., entitled "Thin Si oxide films for MIS tunnel emitter by hollow cathode enhanced plasma oxidation", Thin Solid Films, vol. 281–282, no. 1–2, p. 412–414, 1996. The same is incorporated herein by reference. Yet another low temperature process includes a low temperature VUV enhanced growth of thin silicon dioxide films at low temperatures below 400° C. as described in an article by Patel, P. et al., entitled "Low temperature VUV enhanced growth of thin silicon dioxide films", Applied Surface Science, vol. 46, p. 352–6, 1990. The same is incorporated herein by reference.

Figure 4E:
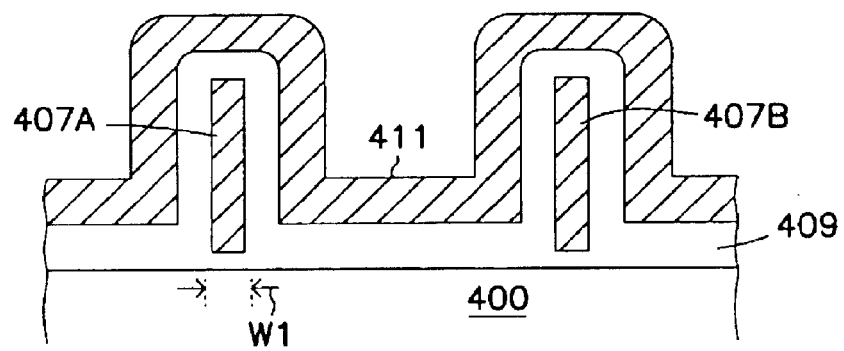

FIG. 4E shows the structure following the next series of steps. In FIG. 4E, another, or second, polysilicon layer 411 is formed over the oxide layer 409 to a thickness of approximately 100 nm. Forming the second polysilicon layer 411 over the oxide layer 409 can be performed using any similar technique to those used in forming the first polysilicon layer 406 as described in detail in connection with FIG. 4B. As shown in FIG. 4E, the second polysilicon layer 411 will be separated by a second oxide thickness, or second insulator thickness (t2) from the active device region 404 which is slightly greater than the thin tunnel oxide thickness, e.g. first oxide thickness or first insulator thickness (t1) which separates the vertical gate structures 407A and 407B from the substrate 400. In one embodiment the second oxide thickness, or second insulator material thickness (t2) is approximately 100 Angstroms (Å) thick. The structure is now as appears in FIG. 4E.

Figure 4F:
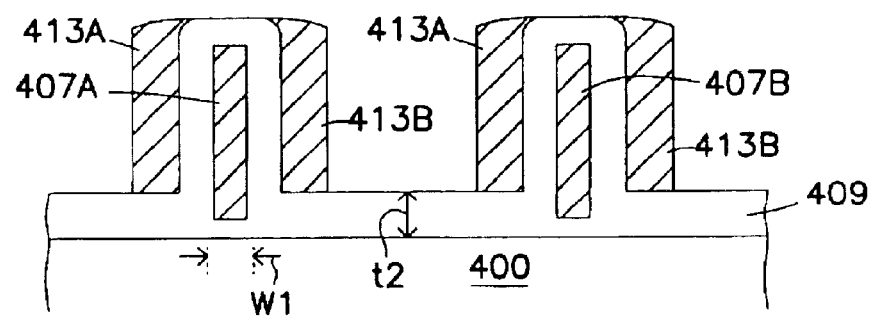

FIG. 4F illustrates the structure after the next series of steps. In FIG. 4F, the structure is once again subjected to an anisotropic etch. The anisotropic etch includes the anisotropic etching process used for etching the first polysilicon layer 406 to form the vertical gate structures 407A and 407B as described in more detail in connection with FIG. 4C. FIG. 4F shows one embodiment of the present invention in which the resulting structure is symmetrical, including two groups of three free standing vertical polysilicon gates. The two groups of three free standing vertical gates include the original vertical gate structures 407A and 407B, and new vertical gate structures 413A and 413B parallel to and on opposing sides of each original vertical gate structures 407A and 407B. This structure embodiment is now as appears in FIG. 4F.

Figure 4G:
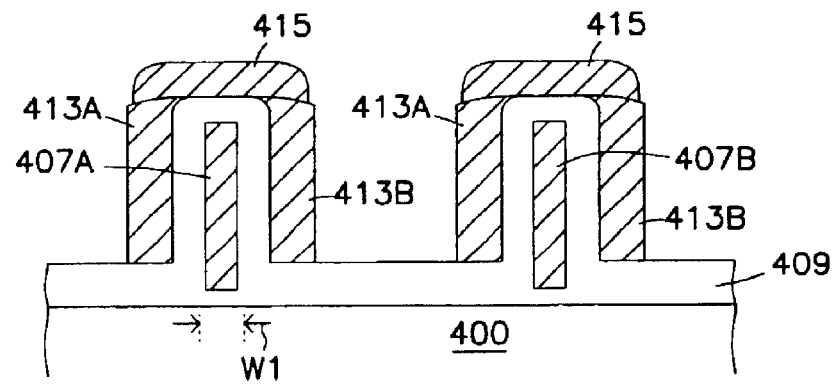

In FIG. 4G, the process is continued to form horizontal polysilicon gate structures above the original vertical gate structures 407A and 407B, and new vertical gate structures 413A and 413B on opposing sides of each original vertical gate structures 407A and 407B. In FIG. 4G, the new vertical gate structures 413A and 413B are connected by forming a third polysilicon layer 415 over a top surface of the structure shown in FIG. 4F. The third polysilicon layer 415 can be formed over the top surface of the structure shown in FIG. 4F using any similar technique to those used in forming the first polysilicon layer 406 as described in detail in connection with FIG. 4B. In one embodiment, according to the teachings of the present invention, the third polysilicon layer 415 is formed to a thickness of approximately 100 nm. In one embodiment, forming the third polysilicon layer 415 is followed by masking and etching techniques, as the same have been described above, in order to leave horizontal polysilicon gate structures 415 only above and connecting the vertical gate structures 413A and 413B. The structure is now as appears in FIG. 4G. FIG. 4G thus represent a symmetrical structure embodiment of the present invention in which the vertical gate structures 413A and 413B, which are parallel to and on opposing sides of each vertical gate structures 407A and 407B, are coupled by the horizontal polysilicon gate structures 415 above the vertical gate structures 407A and 407B. As shown in FIG. 4G, the vertical gate structures 413A and 413B coupled by the horizontal polysilicon gate structures 415 are isolated from vertical gate structures 407A and 407B by insulator layer or oxide layer 409.

In one embodiment, illustrated by FIG. 4H, the structure of FIG. 4G can be anisotropically etched using masking techniques known to one of ordinary skill in the art, as well as the anisotropic etching processes described in connection with FIG. 4F, to produce asymmetrical vertical gate structures. These asymmetrical vertical gate structures will include the original vertical gate structures 407A and 407B, and one remaining vertical gate structure, either 413A or 413B on one side or the other of each original vertical gate structures 407A and 407B as well as a horizontal gate structure 415 depending on the chosen condition of the anisotropic etch process. That is, the anisotropic etch can be performed to leave horizontal gate structure 415 coupled to and above either vertical gate structure 413A or 413B on one side or the other of each original vertical gate structures 407A and 407B. The same is shown in FIG. 4H.

Figure 4H:
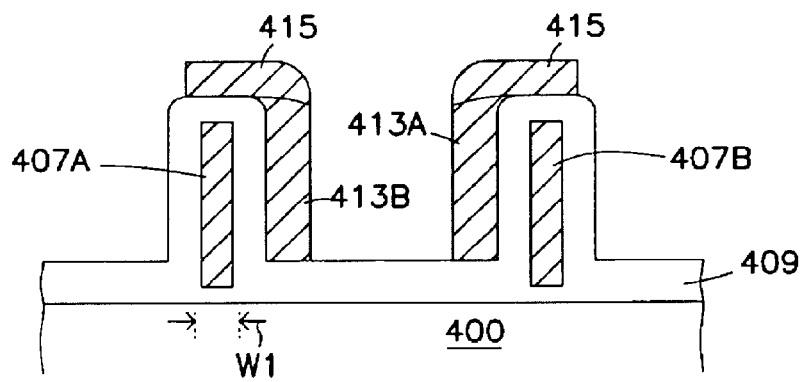
Figure 4I:
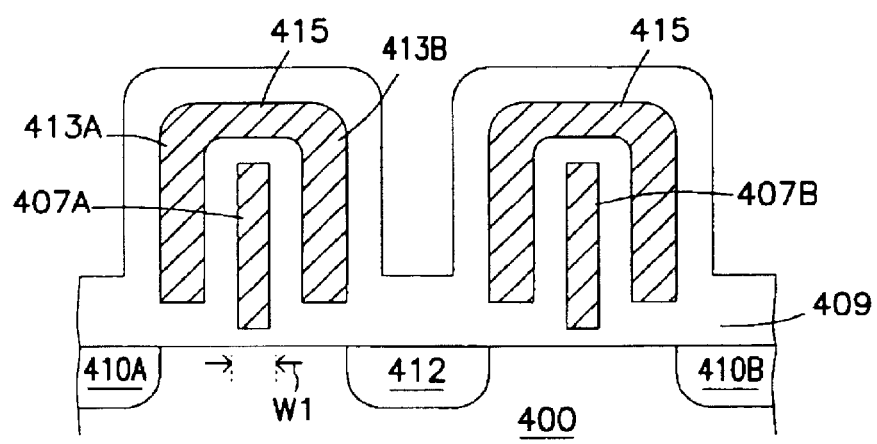

The next series of process steps can continue from either FIGS. 4G or 4H. For purposes of illustration, FIG. 4I provides an illustration of the process steps continued from FIG. 4G. However, one of ordinary skill in the art will understand that analogous process steps may be used to continue the fabrication process from the structure shown in FIG. 4H. In FIG. 4I, the structure from FIG. 4G is oxidized to form an oxide layer of approximately 50 nm. The oxidation process of the structure shown in FIG. 4G can be performed using any suitable technique as the same has been describe above. An ion implantation is then performed to activate source regions shown as 410A and 410B as well as drain region 412. In FIG. 4I, the drain region 412 is illustrated as shared between vertical gate structure 407A and 407B.

One of ordinary skill in the art will understand that other source and drain region configurations can be activated through various ion implantation techniques. Additionally, in one embodiment, the source and/or drain regions can be fabricated with source and/or drain extensions, e.g. similar to source extensions shown in connection with FIG. 3A for facilitating tunneling, by using a masking step and another implantation as the same is known and understood by one of ordinary skill in the art of memory technology. Further conventional process steps can then be used to contact the source, drain and control gate portions of the structure to complete the device of either FIG. 2A or FIG. 3A.

As described above, the structures can be completed such that vertical gates 407A and 407B serve as floating gates for the device structures and vertical gates 413A and 413B serve as control gates. Alternatively, the structures can be completed such that vertical gates 407A and 407B serve as a control gate for the device structures and vertical gates 413A and 413B serve as floating gates.

Figure 1B:
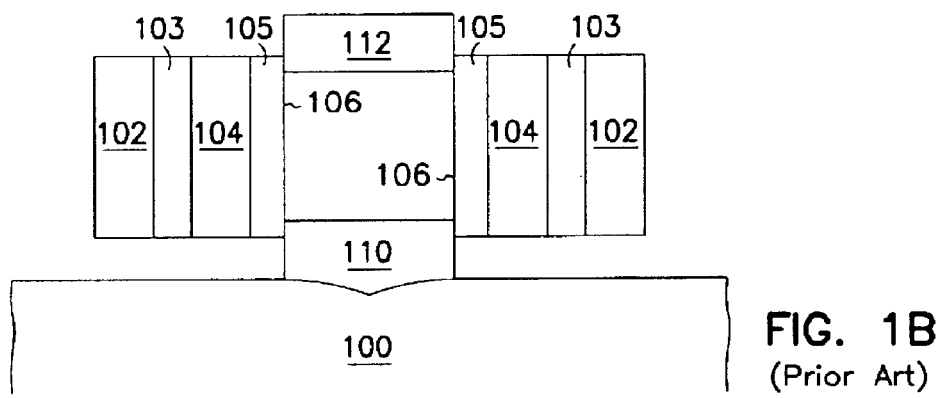
FIG. 1B is an illustration of a vertical EEPROM, EAPROM, or flash memory device formed according to the teachings of the existing art.
Figure 1C:
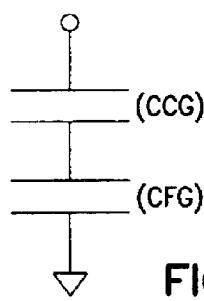
FIG. 1C is a schematic diagram illustrating the generally equivalent capacitances of the control gate (CCG) and the floating gate (CFG) according to the existing art.

As will be understood by reading this disclosure, the memory cells, or floating gate transistors, of the present invention can be fabricated such that the total capacitance of the device is about the same as that of prior art horizontal or vertical floating gate transistor structures, e.g. FIGS. 1A and 1B, of comparable source/drain spacings. However, now since the floating gate capacitance (CFG) for the novel memory cells of the present invention is much smaller than the control gate capacitance (CCG) the majority of any voltage applied to the control gate will appear across the floating gate thin tunnel oxide 401. The floating gate can then be programmed and erased by tunneling of electrons to and from the source of the transistor at relatively low voltages, or programmed by hot electron injection and erased by tunneling.

The operation of the novel memory cells of the present invention is illustrated in connection with FIG. 5A–5E. As explained above, the novel device of the present invention will function on tunneling of electrons to and from the source region of the device for both writing and erase operations, or operate in a tunnel-tunnel mode in conjunction with hot electron injection.

Figure 5A:
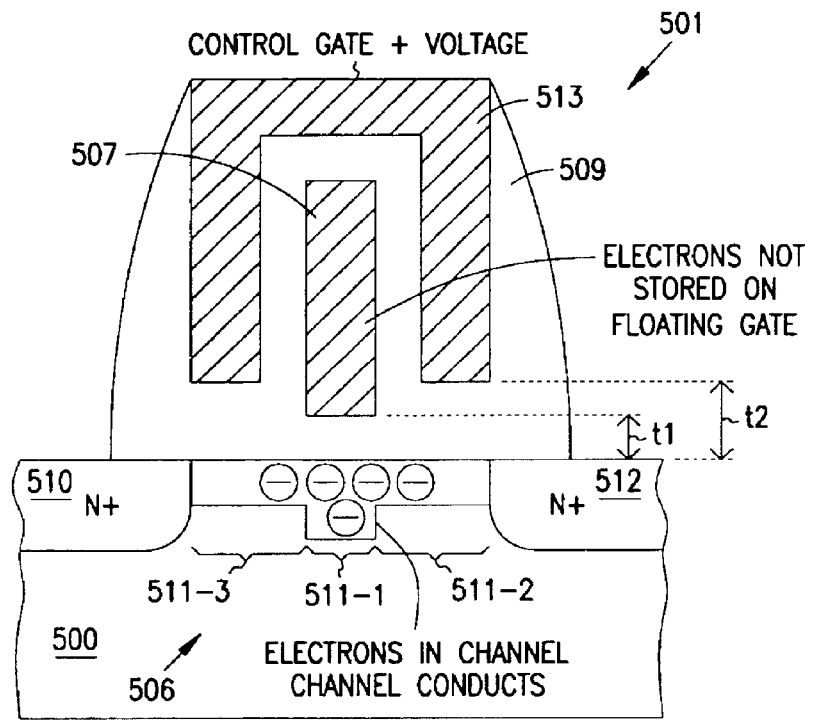
FIGS. 5A–5E are block diagrams illustrating embodiments of the methods for operating the novel memory cells of the present invention.
Figure 5B:
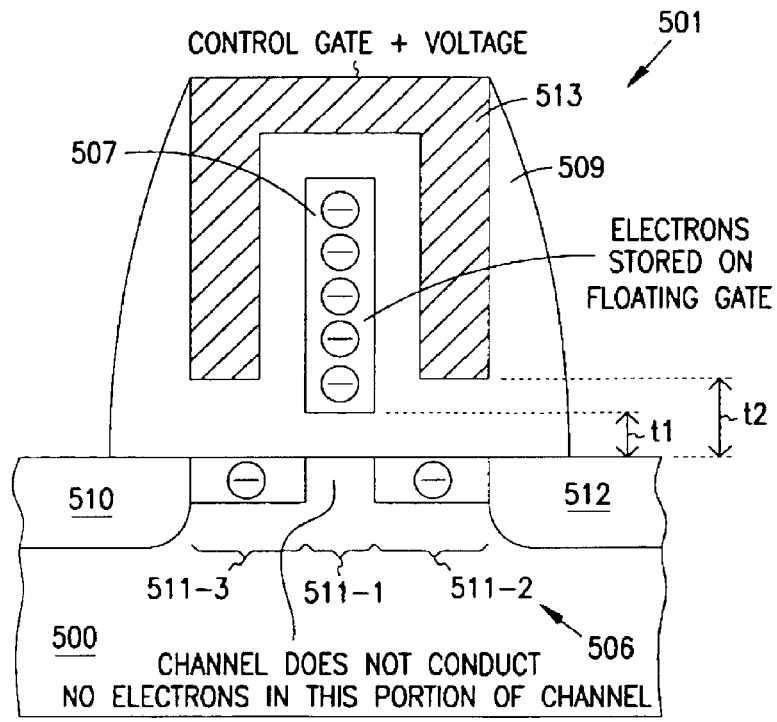

FIG. 5A–5B illustrate the operation of the novel memory cell of FIG. 2A when the outer vertical gates serve as the control gate. In this embodiment, the novel device 501 of the present invention will function on tunneling of electrons to and from the channel region 506 of the device 501 for both writing and erase operations as the same are known and understood by one of ordinary skill in the art. As shown in FIG. 5A, if no electrons are stored on the floating gate 507, then when a potential is applied to the control gate 513, the region of the channel 511-1 beneath the floating gate 507 will actually have a slightly lower threshold voltage (Vt) than the other regions of the channel where the slightly thicker gate oxides (t2) separate the control gate 513 from the channel 506, and the transistor will readily turn on, at lower than conventional control gate voltages, when a read voltage is applied to the control gate 513. In this respect the device functions in a manner analogous to a flash memory cell. On the other hand, as shown in FIG. 5B, if electrons are stored on the floating gate 507, this region of the channel 511-1 beneath the floating gate 507 will have a high threshold voltage (Vt) and will not turn on and conduct when the same low voltage is applied to the control gate 513 to read the memory cell. There are simply no electrons in this region of the channel 511-1 beneath the floating gate 507 to conduct.

Figure 5C:
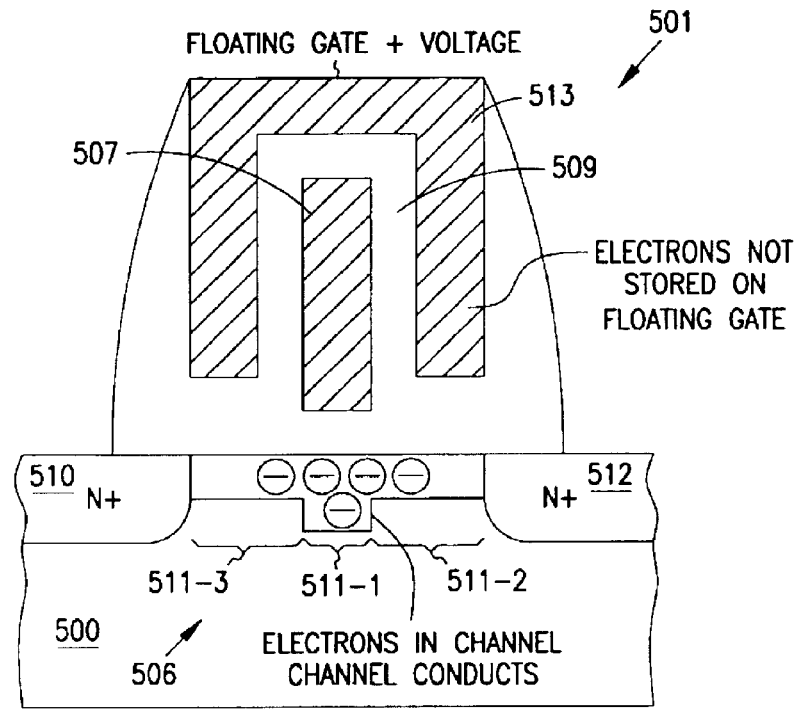
Figure 5D:
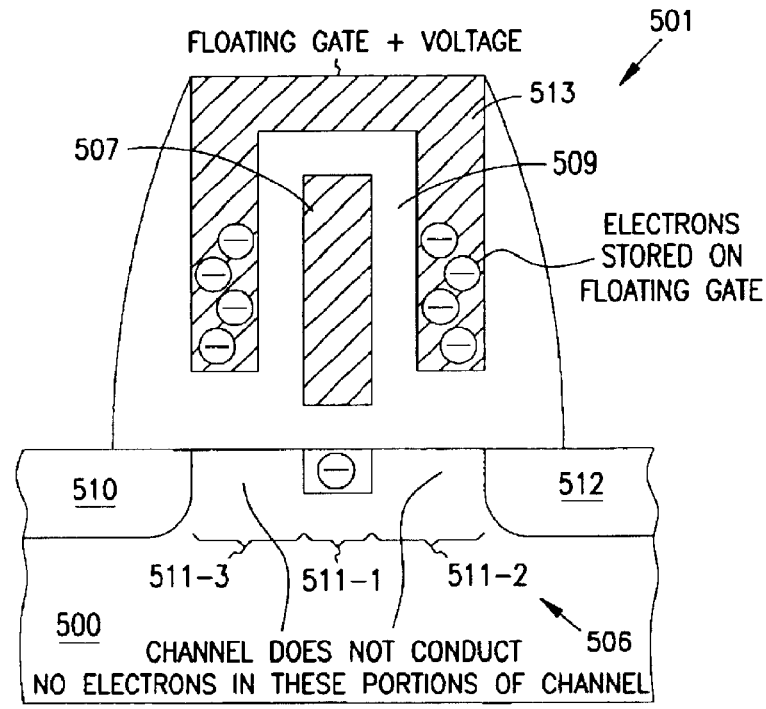

An alternative embodiment is to interchange the functions of the gates, the inner gate 507 becoming the control gate 507 and the outer gate 513 becoming the floating gate 513 as shown in FIGS. 5C–5D. In this embodiment, as shown in FIG. 5C, again with no electrons stored on the floating gate 513, when a potential is applied to the control gate 507, the region of the channel beneath 511-1 the control gate 507 will actually have a slightly lower threshold voltage (Vt) than the other regions of the channel where the slightly thicker gate oxides (t2) separate the floating gate 513 from the channel 506, and the transistor will readily turn on at lower than conventional control gate 507 voltages, when a read voltage is applied to the control gate 507. On the other hand, as shown in FIG. 5D, if electrons are stored on the floating gate 513, the other regions of the channel where the slightly thicker gate oxides (t2) separate the floating gate 513 from the channel 506 will have a high threshold voltage (Vt) and will not turn on and conduct when the same low voltage is applied to the control gate 507 to read the memory cell. There are simply no electrons in these other regions of the channel, e.g. regions 511-2 and 511-3 where the slightly thicker gate oxides (t2) separate the floating gate 513 from the channel 506, to conduct.

Figure 5E:
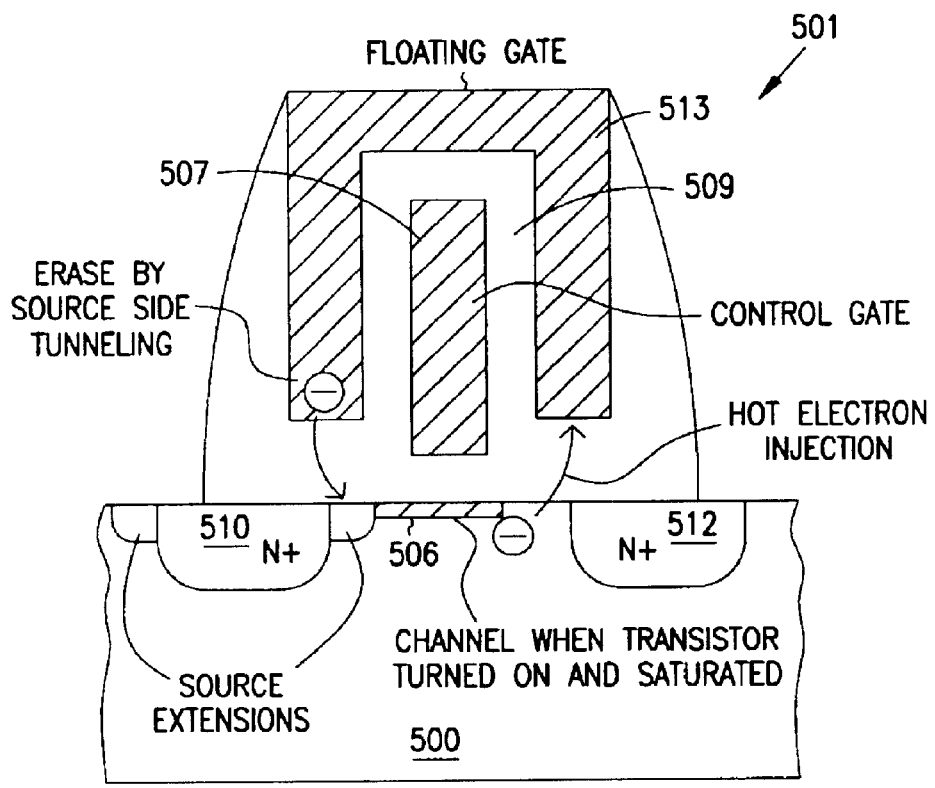

As shown in FIG. 5E, in this later embodiment of FIGS. 5C–5D, the erase operation will be performed using source side 510 tunneling. The write operation, however, will use hot electron injection from the channel region 506 at the drain region 512 to write electrons on to the floating gate 513 as is commonly done in some flash memory cells. As one of ordinary skill will understand upon reading this disclosure, similar operation modes can be employed based on the particular floating gate to control gate configuration selection for the structure embodiment shown in FIG. 3A.

Figure 6:
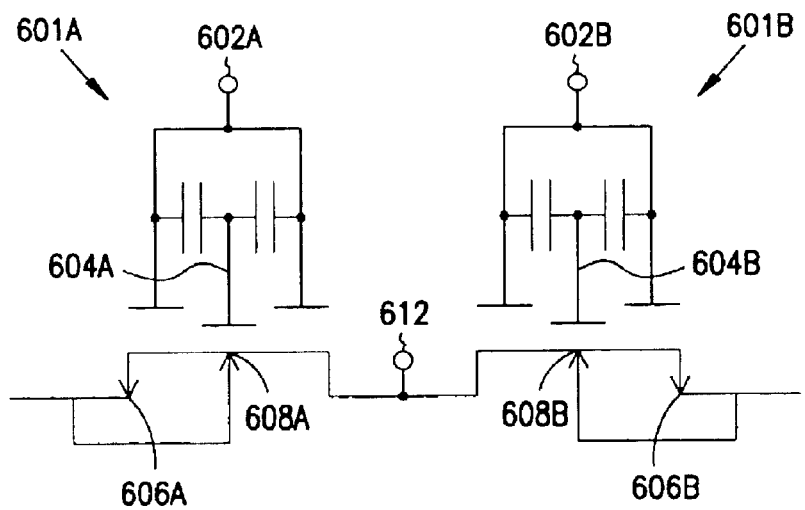
FIG. 6 is a schematic drawing illustrating one circuit diagram embodiment and application for the novel memory cells of the present invention.

FIG. 6 is a schematic drawing illustrating one circuit diagram embodiment and application of the novel memory cell shown in FIG. 2A in a NOR type memory cell with two devices 601A and 601B. In the embodiment shown in FIG. 6, the two devices 601A and 601B share a common drain 612. As explained in detail above, according to the teachings of the present invention, vertical gates 602A and 602B are included. Further the two devices 601A and 601B include vertical gates 604A and 604B. These vertical gates, 602A, 602B, 604A and 604B, are formed over horizontal body regions, 608A and 608B respectively, in devices 601A and 601B. The horizontal body regions will conduct between source regions 606A and 606B, respectively, and the common drain region 612 according to the conditions detailed and described above for the novel memory cells of the present invention. As one of ordinary skill in the art will understand upon reading this disclosure, the NOR circuit embodiment of FIG. 6 can similarly substitute the novel memory cell structure shown in FIG. 3A for the two devices 601A and 601B. The invention is not so limited. Further, as one of ordinary skill in the art will understand upon reading this disclosure, other circuit diagram embodiments can similarly be configured using the novel memory cells of the present invention. As one of ordinary skill in the art will understand upon reading this disclosure, these devices can be used in a variety of flash memory, EEPROM, and/or EAPROM arrays and applications. The invention is not so limited.

Figure 7:
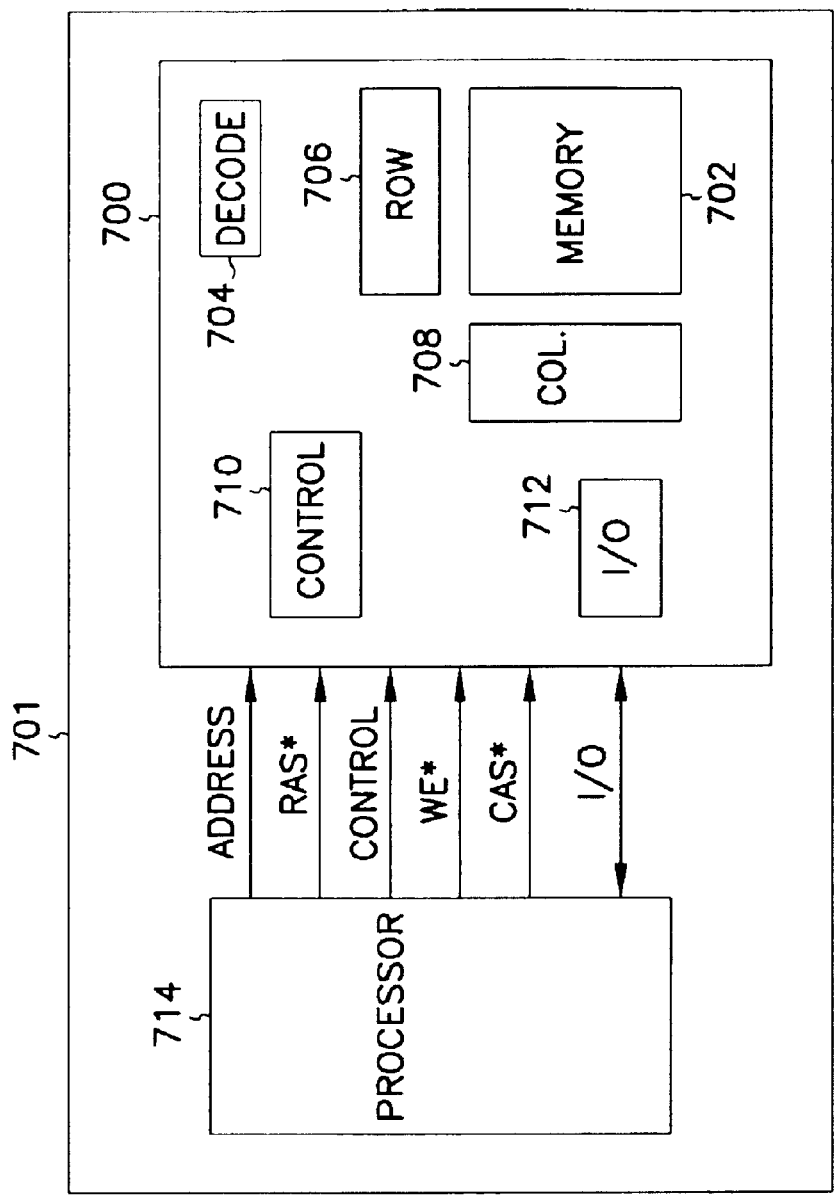
FIG. 7 illustrates a block diagram of an embodiment of an electronic system including a novel memory cell formed according to the teachings of the present invention.

FIG. 7 illustrates a block diagram of an embodiment of an electronic system 701 according to the teachings of the present invention. In the embodiment shown in FIG. 7, the system 701 includes a memory device 700 which has an array of memory cells 702, address decoder 704, row access circuitry 706, column access circuitry 708, control circuitry 710, and input/output circuit 712. Also, as shown in FIG. 7, the circuit 701 includes a processor 714, or memory controller for memory accessing. The memory device 700 receives control signals from the processor 714, such as WE*, RAS* and CAS* signals over wiring or metallization lines. The memory device 700 is used to store data which is accessed via I/O lines. It will be appreciated by those skilled in the art that additional circuitry and control signals can be provided, and that the memory device 700 has been simplified to help focus on the invention. At least one of the memory cells 702 has a memory cell formed according to the embodiments of the present invention.

It will be understood that the embodiment shown in FIG. 7 illustrates an embodiment for electronic system circuitry in which the novel memory cells of the present invention. The illustration of system 701, as shown in FIG. 7, is intended to provide a general understanding of one application for the structure and circuitry of the present invention, and is not intended to serve as a complete description of all the elements and features of an electronic system using the novel memory cell structures. Further, the invention is equally applicable to any size and type of memory device 701 using the novel memory cells of the present invention and is not intended to be limited to the described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 8:
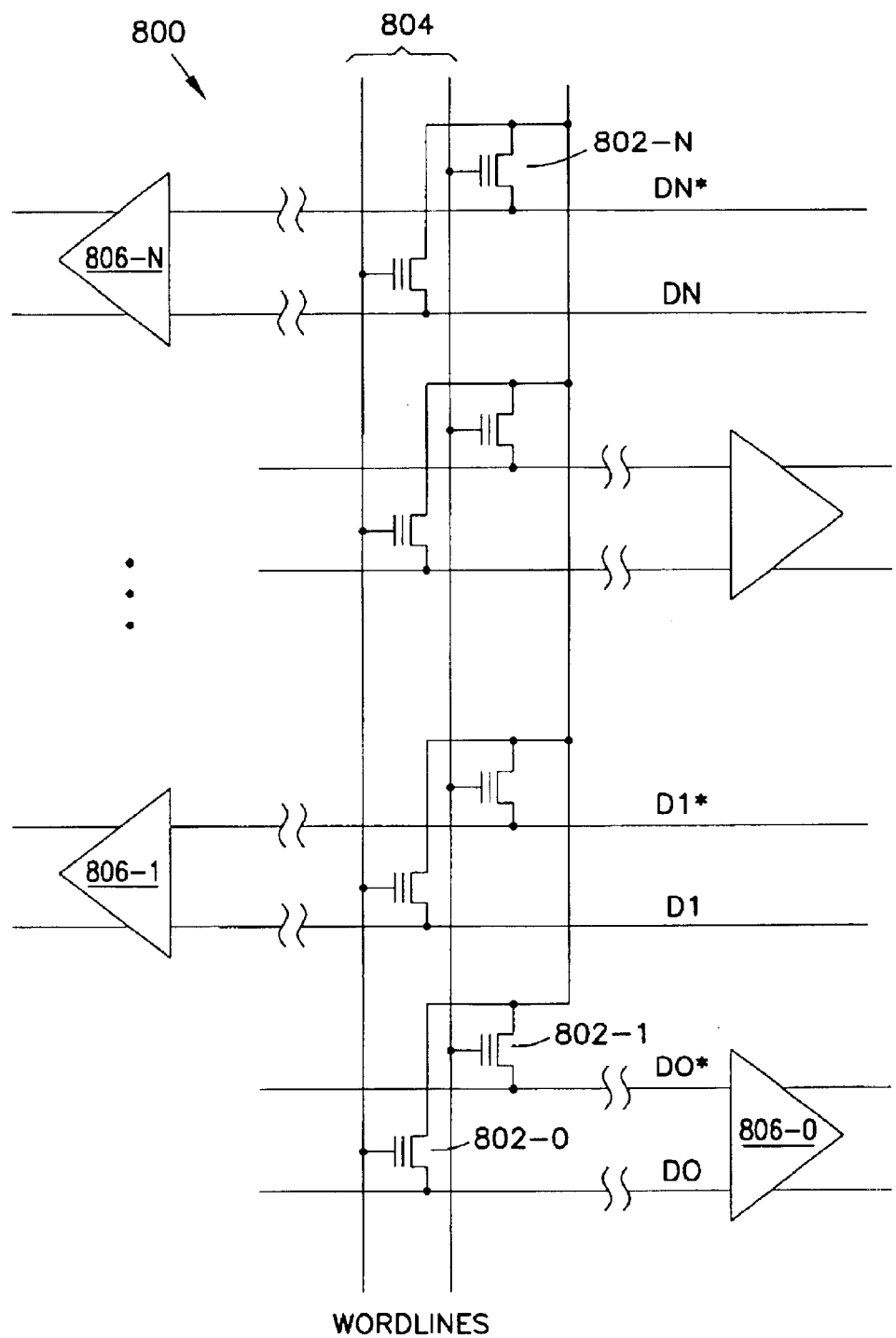
FIG. 8 illustrates an embodiment of a memory array including a novel memory cell formed according to the teachings of the present invention, as can be included in a memory device, e.g. on a memory chip/die.

FIG. 8 illustrates an embodiment of a memory array 800, according to the teachings of the present invention, as can be included in a memory device, e.g. on a memory chip/die. The memory array shown in FIG. 8 includes a plurality of memory cells, 802-0, 802-1, . . . , 802-N. The plurality of memory cells, 802-0, 802-1, . . . , 802-N, includes at least one novel memory cell formed according to the teachings of the present invention. As shown in FIG. 8, the plurality of memory cells are coupled to a plurality, or number of sense amplifiers 806-0, 806-1, . . . , 806-N via a number of bit lines, or digitlines, D0*, D0, D1*, D1, . . . , DN*. FIG. 8 is illustrative of the manner in which the novel memory cell of the present invention can be used in a folded bit line configuration, in substitution for a conventional folded bit line memory array. One of ordinary skill in the art will understand upon reading this disclosure, that the novel memory cells of the present invention can further be used in an open bit line configuration or any other digitline twist scheme. The invention is not so limited.

The Figures presented and described in detail above are similarly useful in describing the method embodiments of operation for novel memory cell of the present invention. That is one embodiment of the present invention includes applying a first potential across a thin tunneling oxide between a vertical floating gate and a first portion of a horizontal substrate in order to add or remove a charge from the floating gate. As described in detail above, the horizontal substrate includes a source region and a drain region separated by a horizontal channel region. This method embodiment further includes reading the memory cell by applying a second potential to a vertical control gate located above a second portion of the horizontal substrate. The vertical control gate is parallel to and opposing the vertical floating gate.

Another method embodiment of the present invention includes writing a charge from a horizontal substrate to a vertical floating gate by applying a first potential to a vertical control gate. This method embodiment includes erasing a charge from a vertical floating gate to a source region in a horizontal substrate by applying a second potential to the vertical control gate. This method embodiment further includes reading the memory cell by applying a third potential to the vertical control gate. Applying a first, second, and third potential to the vertical control gate includes applying a first, second, and third potential to a vertical control gate which is parallel to and opposing the vertical floating gate. In one embodiment for one of the novel memory cell structures described above, the method of writing a charge from a horizontal substrate to a vertical floating gate by applying a first potential to a vertical control gate includes tunneling electrons from a horizontal channel in the horizontal substrate to the vertical floating gate using Fowler Nordheim tunneling. In another embodiment for another of the novel memory cell structures described above, the method of writing a charge from a horizontal substrate to a vertical floating gate by applying a first potential to a vertical control gate includes using a hot electron injection technique to tunnel electrons at a drain region in the horizontal substrate to the vertical floating gate. Erasing a charge from a vertical floating gate to a source region in a horizontal substrate by applying a second potential to the vertical control gate includes tunneling electrons from the vertical floating gate to the source region in a horizontal substrate using Fowler Nordheim tunneling.

Another method embodiment of the present invention includes using a vertical control gate to add and remove a charge to a vertical floating gate. This method embodiment includes using the charge stored on the vertical floating gate to modulate a horizontal conduction channel beneath the vertical floating gate. The method further includes sensing a conduction level through the horizontal channel to sense a state of the memory cell. According to the teachings of the present invention, the conduction level through the horizontal channel is modulated by a charge level in a vertical floating gate.

Another method embodiment of the present invention includes storing a charge in a vertical floating gate and using the charge stored in the vertical floating gate to control a threshold voltage level required to create conduction in a horizontal channel region beneath the vertical floating gate.

CONCLUSION

Thus, the present invention provides structures and methods for memory devices which operate with lower control gate voltages than conventional flash, EEPROM, and/or EAPROM devices. The structures and methods of the present invention use thin silicon dioxide ($SiO_2$) layers as an insulator material, in place of higher dielectric constant materials, for separating the control gate and floating gate. Thus, the structures and methods of the present invention do not increase the costs or complexity of the device fabrication process. These systems and methods are fully scalable with shrinking design rules and feature sizes in order to provide even higher density integrated circuits. The total capacitance of these memory devices is about the same as that for the prior art floating gate transistor devices of comparable source and drain spacings. However, according to the teachings of the present invention, the floating gate capacitance is much smaller than the control gate capacitance such that the majority of any voltage applied to the control gate will appear across the floating gate thin tunnel oxide allowing the device to operate with lower control gate voltages. In sum, the devices of the present invention can be programmed by tunneling of electrons to and from the silicon substrate at lower control gate voltages than is possible in the prior art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A memory cell, comprising:
   a source region in a horizontal substrate;
   a drain region in the horizontal substrate;
   a channel region separating the source and the drain regions;
   an edged defined control gate vertically situated above the channel region and separated from the channel region by a first thickness insulator material;
   a first edged defined floating gate horizontally situated above the control gate and separated from the control gate by an intergate dielectric; and
   a second edged defined floating gate vertically situated and parallel to one side of the control gate, wherein the second edge defined floating gate is attached to a first end of the first edged defined floating gate and wherein the second edged defined floating gate is separated from the channel region by a second thickness insulator material, the second edged defined floating gate separated from the edged defined control gate by the intergate dielectric.

2. The memory cell of claim 1 further comprising, a third edged defined floating gate vertically situated and parallel to a second side of the control gate, wherein the third edged defined floating gate is attached to a second end of the first edged defined floating gate and wherein the third edged defined floating gate is separated from the channel region by the second thickness insulator material, the third edged defined floating gate is separated from the edged defined control gate by the intergate dielectric.

3. The memory cell of claim 2 wherein a lower end of the edged defined control gate extends below a lower end of the second edged defined floating gate.

4. The memory cell of claim 1 wherein the edged defined control gate has a horizontal width of approximately 100 nanometers (nm).

5. The memory cell of claim 1, wherein the first thickness insulator material is approximately 60 Angstroms (Å), and wherein the second thickness insulator material is approximately 100 Angstroms (Å).

6. The memory cell of claim 1, wherein the first thickness insulator material, the second thickness insulator material, and the intergate dielectric include silicon dioxide (SiO2).

7. The memory cell of claim 1, wherein the edged defined vertical control gate has a vertical height of approximately 500 nanometers (nm) and a horizontal width of approximately 100 Angstroms (Å).

8. The memory cell of claim 1, wherein the intergate dielectric has a thickness approximately equal to the first thickness insulator material.

9. A transistor, comprising:
   a horizontal substrate, wherein the substrate includes a source region, a drain region, and
   a channel region separating the source and the drain region;
   an edge-defined vertical control gate separated from a first portion of the channel region by a first oxide thickness;
   a first edge-defined vertical floating gate separated from a second portion of the channel region by a second oxide thickness, wherein the first vertical floating gate is parallel to and opposing a first side of the vertical control gate;
   a second edge-defined vertical floating gate separated from the second portion of the channel region by the second oxide thickness, wherein the second vertical floating gate is parallel to and opposing a second side of the vertical control gate; and
   a horizontal edge-defined floating gate coupled to top portions of the first and second vertical floating gates.

10. The transistor of claim 9, wherein the vertical control gate has a vertical height of approximately 500 nanometers (nm) and a horizontal width of approximately 100 nanometers (nm).

11. The transistor of claim 9, wherein the first oxide thickness is approximately 60 Angstroms (Å), and wherein the second oxide thickness is approximately 100 Angstroms (Å).

12. The transistor of claim 9, wherein the vertical floating gates have horizontal widths of approximately 100 Angstroms (Å).

13. The transistor of claim 9, wherein the horizontal floating gate and the vertical floating gates are separated from the vertical control gate by an intergate dielectric.

14. The transistor of claim 9, wherein a capacitance between the control gate and the floating gates is greater than a capacitance between the floating gates and the channel.

15. A floating gate transistor, comprising:
   a horizontal substrate, wherein the substrate includes a source region, a drain region, and a channel region separating the source and the drain region;
   two edged defined floating gates connected at their ends and forming a right angle at their connected ends, with one of the floating gates being situated horizontally and another of the floating gates being situated vertically, the vertically situated floating gate separated from the channel region by a first oxide thickness; and a edged defined control gate vertically situated separated from the two edged defined floating gates by an intergate dielectric, wherein the edged defined control gate is parallel on one side to the vertical situated floating gate, and wherein the edged defined control gate is separated from the channel region by a second oxide thickness.

16. The floating gate transistor of claim 15 further comprising a third edged defined floating gate vertically situated and attached to a different and opposing end of the horizontally situated floating gate, wherein the third edged defined floating gate is separated from the edged defined control gate by the intergate dielectric and separated from the channel region by the first oxide thickness.

17. The floating gate transistor of claim 16, wherein the two vertically situated edged defined floating gates and the edged defined control gate vertical gate include polysilicon gates which are separated from one another by silicon dioxide (SiO2).

18. The floating gate transistor of claim 16, wherein the two vertically situated edged defined floating gates and the edged defined control gate vertical gate each have a horizontal width of approximately 100 nanometers (nm).

19. The floating gate transistor of claim 15, wherein the first oxide thickness is approximately 60 Angstroms (Å), and wherein the second oxide thickness is approximately 100 Angstroms (Å).

20. The floating gate transistor of claim 15, wherein the first oxide thickness is approximately equal in thickness to the second oxide thickness.

21. A memory cell, comprising:

a horizontal floating gate coupled to top portions of two opposing vertical floating gates, and wherein the vertical floating gates are parallel with one another; and a non-coupled vertical control gate separated from the two vertical floating gates and the horizontal floating gate by a intergate dielectric, wherein the non-coupled vertical control gate is interposed between the two vertical floating gates.

22. The memory cell of claim 21 wherein the two vertical floating gates are separated from a channel region by a first oxide thickness.

23. The memory cell of claim 22 wherein the control gate is separated from the channel region by a second oxide thickness.

24. A memory cell comprising:

a horizontal floating gate coupled to the ends of two opposing and parallel vertical floating gates; and a vertical control gate that is separated from the floating gates by an intergate dielectric, and wherein the vertical gate is also parallel to and is interposed between the two parallel vertical floating gates.

25. The memory cell of claim 24 wherein the gates are located above a channel region for the memory cell.

26. The memory cell of claim 24 wherein the channel region separates source and drain regions of a horizontal substrate for the memory cell.

27. A transistor comprising:

a first floating gate horizontally situated;

a second floating gate vertically situated;

a third floating gate vertically situated; and a control gate vertically situated;

wherein the floating gates surround the control gate on three sides of the control gate and are separated from the control gate by an intergate dielectric, and wherein at least two of the floating gates are separated by and parallel to the control gate.

28. The transistor of claim 27 wherein the second and third floating gates and the control gate are separated from a channel region by a same oxide thickness.

29. The transistor of claim 27 wherein the second and third floating gates are separated from a channel region by a different oxide thickness than the control gate.

30. A transistor comprising:

three coupled floating gates coupled on their ends with one another, where two of the coupled floating gates are parallel with one another; and a non-coupled control gate surrounded on three sides by the three coupled floating gates and interposed between the two parallel floating gates, and further separated by an intergate dielectric from the three coupled floating gates.

31. The transistor of claim 30 wherein the two parallel floating gates are coupled indirectly with one another through the remaining coupled floating gate.

32. The transistor of claim 30 wherein the two parallel floating gates are separated from a channel region by a first oxide thickness and the control gate is separated from the channel region by a second oxide thickness.

* * * * *